United States Patent
Kim et al.

(10) Patent No.: US 10,361,223 B2
(45) Date of Patent: Jul. 23, 2019

(54) DISPLAY DEVICE

(71) Applicant: SAMSUNG DISPLAY CO., LTD., Yongin, Gyeonggi-Do (KR)

(72) Inventors: Kwang Min Kim, Seoul (KR); Won Kyu Kwak, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/498,113

(22) Filed: Sep. 26, 2014

(65) Prior Publication Data

US 2015/0270287 A1 Sep. 24, 2015

(30) Foreign Application Priority Data

Mar. 24, 2014 (KR) .................. 10-2014-0034244

(51) Int. Cl.
*H01L 27/32* (2006.01)
*H01L 27/12* (2006.01)
*G09G 3/32* (2016.01)

(52) U.S. Cl.
CPC ........ *H01L 27/124* (2013.01); *H01L 27/3276* (2013.01); *G09G 3/32* (2013.01); *G09G 2300/0426* (2013.01); *G09G 2330/06* (2013.01)

(58) Field of Classification Search
CPC .................. H01L 27/3265; H01L 27/3262
USPC .......................................... 257/71
See application file for complete search history.

(56) References Cited

U.S. PATENT DOCUMENTS

| | | | |
|---|---|---|---|
| 2005/0142679 A1* | 6/2005 | Ahn | G02F 1/1309 438/30 |
| 2008/0135846 A1* | 6/2008 | Shin | H01L 27/0248 257/59 |
| 2009/0026932 A1* | 1/2009 | Kwak | H01L 27/3276 313/504 |
| 2009/0045732 A1* | 2/2009 | Kwak | G09G 3/006 313/504 |
| 2009/0091673 A1 | 4/2009 | Chen et al. | |
| 2013/0062607 A1* | 3/2013 | Yamazaki | H01L 27/1225 257/59 |
| 2014/0225126 A1* | 8/2014 | Aketa | H01L 29/41766 257/77 |

FOREIGN PATENT DOCUMENTS

| | | |
|---|---|---|
| JP | 2007-122071 | 5/2007 |
| KR | 10-2007-0016088 | 2/2007 |
| KR | 10-2008-0000097 | 1/2008 |
| KR | 10-2008-0078089 | 8/2008 |
| KR | 10-2012-0056507 | 6/2012 |

* cited by examiner

*Primary Examiner* — Moazzam Hossain
*Assistant Examiner* — Hajar Kolahdouzan
(74) *Attorney, Agent, or Firm* — Lewis Roca Rothgerber Christie LLP

(57) ABSTRACT

A display device includes a substrate which has a display area and a non-display area adjacent to the display area, a first conductive wiring at the non-display area of the substrate, and a second conductive wiring at the non-display area of the substrate and on the first conductive wiring. The second conductive wiring surrounds at least a part of the first conductive wiring.

4 Claims, 10 Drawing Sheets

DISPLAY DEVICE

CROSS-REFERENCE TO RELATED APPLICATION

This application claims priority to and the benefit of Korean Patent Application No. 10-2014-0034244 filed on Mar. 24, 2014 in the Korean Intellectual Property Office, the disclosure of which is incorporated herein by reference in its entirety.

BACKGROUND

1. Field

The present invention relates to a display device.

2. Description of the Related Art

A display device is a device that visually displays data. Examples of the display device include a liquid crystal display (LCD), an electrophoretic display, an organic light-emitting display, an inorganic electroluminescent (EL) display, a field emission display, a surface-conduction electron-emitter display, a plasma display, and a cathode ray display.

The display device includes a lot of wirings not only in a display area in which an image is displayed but also in a non-display area in which no image is displayed. The wirings are important elements that deliver a switching signal, an image signal, etc. from a driver located on the non-display area to pixels disposed on the display area.

As a display device becomes more highly integrated, a gap between wirings included in the display device is reduced. For example, in a display device having a narrow bezel, gaps between a plurality of wirings located in a non-display area is very small. In this state, if electrostatic discharge (ESD) occurs in a region in which a plurality of wirings are concentrated, the wirings may be damaged. For example, the wirings may snap or short-circuit. This directly adversely affects the display quality of the display device.

SUMMARY

Aspects of the present invention provide a display device structured to protect a plurality of wirings from electrostatic discharge (ESD).

Aspects of the present invention are not restricted to the embodiments described herein. The above and other aspects of the present invention will become more apparent to one of ordinary skill in the art to which the present invention pertains by referencing the detailed description of the present invention given below.

According to an aspect of the present invention, there is provided a display device including: a substrate including a display area and a non-display area adjacent the display area, a first conductive wiring at the non-display area of the substrate, and a second conductive wiring at the non-display area of the substrate and on the first conductive wiring, wherein the second conductive wiring surrounds at least a part of the first conductive wiring.

A gate voltage may be applied to the first conductive wiring, and a power supply voltage may be applied to the second conductive wiring.

The second conductive wiring may have a lower resistivity than the first conductive wiring.

The first conductive wiring may include molybdenum, and the second conductive wiring may include aluminum.

The display device may further include a flexible film coupled to the substrate, where the second conductive wiring surrounds a portion of the first conductive wiring adjacent the flexible film.

The second conductive wiring may include: a first wiring extending along edges of the substrate, and a second wiring located at an inner side of the first wiring and has both ends coupled to the first wiring, and the first wiring and the second wiring may surround at least part of the first conductive wiring.

At least part of the second wiring may overlap the first conductive wiring.

Both ends of the second wiring coupled to the first wiring may be located at a portion of the non-display area adjacent a flexible film coupled to the substrate.

The first wiring and the second wiring form a closed loop, the closed loop being located at a corner of the substrate.

The first wiring and the second wiring may surround the display area.

The second conductive wiring further includes a bridge wiring coupling the first wiring and the second wiring.

The display device may further include: a gate wiring at the display area of the substrate, and a data wiring on the gate wiring and crossing the gate wiring, where the first conductive wiring is coupled to the gate wiring, and the second conductive wiring is at the same plane as the data wiring.

The display device may further include a thin-film transistor (TFT) at the display area of the substrate, where the TFT may include: a gate electrode on the substrate, a semiconductor pattern on the gate electrode, and source and drain electrodes on the semiconductor pattern, where the first conductive wiring is at the same plane as the gate electrode, and the second conductive wiring is at the same plane as the source and drain electrodes.

The display device may further include a light-emitting device at the display area of the substrate, the light-emitting device being coupled to the TFT, where the light-emitting device may include: a first electrode located on the source and drain electrodes, and coupled to the drain electrode, an organic light-emitting layer on the first electrode, and a second electrode on the organic light-emitting layer, where the second conductive wiring is electrically coupled to the second electrode.

According to another aspect of the invention, there is provided a display device including: a substrate including a display area and a non-display area adjacent the display area, a first conductive wiring at the non-display area of the substrate, and a second conductive wiring at the non-display area of the substrate and on the first conductive wiring, where the second conductive wiring includes an extension, where the extension overlaps at least part of the first conductive wiring.

The display device where a gate voltage may be applied to the first conductive wiring, and a power supply voltage may be applied to the second conductive wiring.

The second conductive wiring may have a lower resistivity than the first conductive wiring.

The extension may be at a corner of the substrate.

The extension may surround the display area.

The display device may further include a flexible film coupled to the substrate, where the extension is located at a region adjacent the flexible film.

BRIEF DESCRIPTION OF THE DRAWINGS

The above and other aspects and features of the present invention will become more apparent by describing in detail example embodiments thereof with reference to the attached drawings, in which.

DETAILED DESCRIPTION

Figure 1:
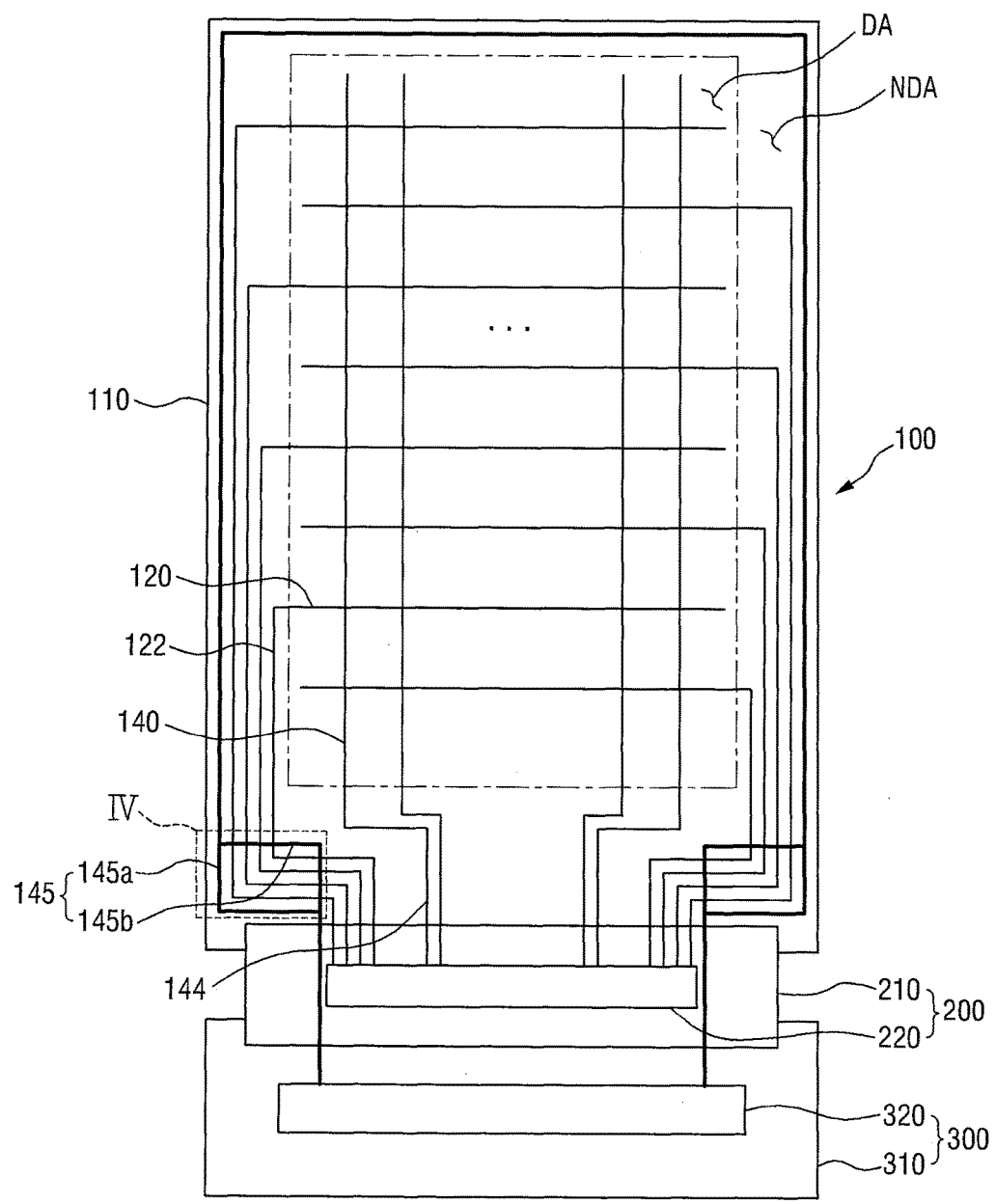
FIG. 1 is a plan view of a display device according to an embodiment of the present invention.

The aspects and features of the present invention and methods for achieving the aspects and features will be apparent by referring to the embodiments described in detail with reference to the accompanying drawings. However, the present invention is not limited to the embodiments disclosed herein, but can be implemented in diverse forms. The matters defined in the description, such as the detailed construction and elements, are example details provided to assist those having ordinary skill in the art with a comprehensive understanding of the invention, and the present invention is defined within the scope of the appended claims and their equivalents.

The term "on" that is used to designate that an element is on another element or located on a different layer or a layer includes both a case where an element is located directly on another element or a layer and a case where an element is located on another element via another layer or still another element. In the entire description of the present invention, the same drawing reference numerals are used for the same elements across various figures. When a first element is described as being "coupled" or "connected" to a second element, the first element may be directly coupled or connected to the second element, or indirectly coupled or connected with one or more intervening elements therebetween.

Although the terms "first, second, and so forth" are used to describe diverse constituent elements, such constituent elements are not limited by the terms. The terms are used to discriminate a constituent element from other constituent elements. Accordingly, in the following description, a first constituent element may be a second constituent element.

A display device is a device which displays an image and may be a liquid crystal display, an electrophoretic display, an organic light-emitting display, an inorganic electroluminescent display, a field emission display, a surface-conduction electron-emitter display, a plasma display, a cathode ray display, etc.

An organic light-emitting display (e.g., organic light-emitting diode (OLED) display) will hereinafter be described as an example of a display device according to an embodiment of the present invention. However, a display device according to the present invention is not limited to the organic light-emitting display, and various types of display devices can be used.

Hereinafter, embodiments of the present invention will be described.

FIG. 1 is a plan view of a display device according to an embodiment of the present invention. Referring to FIG. 1, the display device according to the described embodiment may include a display panel 100, a flexible circuit film 200 which includes a flexible film 210 and a driver 220, and a circuit board 300 which includes a board unit 310 and a power supply unit 320.

The display panel 100 is a panel that displays an image. In the example embodiment of FIG. 1, the display panel 100 is rectangular. However, the shape of the display panel 100 is not limited to the rectangular shape, and the display panel 100 may have various shapes such as, for example, a circle and an oval. The display panel 100 may include a substrate 110 and a plurality of wirings located on the substrate 110.

The substrate 110 may support various elements included in the display panel 100. According to an embodiment, the substrate 110 may be rectangular. In some embodiments, the substrate 110 may be a rigid substrate. However, the substrate 110 is not limited to the rigid substrate and may also be a flexible substrate. In an example embodiment, the substrate 110 may be made of an insulating material such as, for example, a glass or plastic material.

The substrate 110 may include a display area DA and a non-display area NDA adjacent to the display area DA. Here, the display area DA may be an area where an image is displayed, and the non-display area NDA may be an area where no image is displayed. A plurality of pixels which emit light may be arranged in the display area DA. In an example embodiment, the display area DA may be surrounded by the non-display area NDA. That is, the display area DA may be located in a central portion of the substrate 110, and the non-display area NDA may be located at an edge portion of the substrate 110 (e.g., around the outside of the display area DA). However, the present invention is not limited thereto, and the display area DA and the non-display area NDA may also be arranged side by side.

A plurality of wirings may be formed on the substrate 110. The wirings may include gate wirings 120 and data wirings 140. The wirings may further include first conductive wirings 122, a second conductive wiring 145, and third conductive wirings 144 located on the non-display area NDA of the substrate 110. In some embodiments, the wirings may include various wirings in addition to the above wirings.

The gate wirings 120 may also be located in the display area DA of the substrate 110. The gate wirings 120 may extend along a horizontal direction of the display area DA. The gate wirings 120 may deliver gate signals received from the driver 220 to the pixels in the display area DA. The gate wirings 120 may include molybdenum (e.g., may be made of molybdenum).

The data wirings 140 may be located in the display area DA of the substrate 110. The data wirings 140 may be located on the gate wirings 120. For example, the data wirings 140 may cross the gate wirings 120. An insulating material may be interposed between the gate wirings 120 and the data wirings 140. The data wirings 140 may extend along a vertical direction of the display area DA to cross the gate wirings 120. The data wirings 140 may deliver data signals received from the driver 220 to the pixels in the display area DA. The data wirings 140 may include a metal (may be made of a metal such as, e.g., aluminum) having lower resistivity than molybdenum.

The first conductive wirings 122 may be located in the non-display area NDA of the substrate 110. In an example embodiment, the first conductive wirings 122 may couple the gate wirings 120 and the driver 220. That is, the first conductive wirings 122 may receive gate signals from the driver 220 and deliver the received gate signals to the gate wirings 120. In another example embodiment, the first conductive wirings 122 may include a floating dummy wiring. The dummy wiring may be a lighting circuit wiring which determines whether the display panel 100 is operating during the process of manufacturing the display panel 100. In another example embodiment, the first conductive wirings 122 may include a signal transmission wiring which delivers, e.g., a clock signal.

In some embodiment, the first conductive wirings 122 may be made of the same material as the gate wirings 120. That is, the first conductive wirings 122 may include molybdenum. The first conductive wirings 122 may be formed at the same time as the gate wirings 120. In some embodiments, the first conductive wirings 122 may lie in the same plane with the gate wirings 120.

The second conductive wiring 145 may be located in the non-display area NDA of the substrate 110. The second conductive wiring 145 may extend along the edges of the substrate 110. In addition, the second conductive wiring 145 may surround the display area DA. At least a part of the second conductive wiring 145 may be between the first wiring conductive wirings 122 and an edge of the substrate 110. The second conductive wiring 145 may be coupled to the power supply unit 320. In some embodiments, the second conductive wiring 145 may be coupled to a second electrode 190 (see FIG. 3) which will be described later to apply a power supply voltage to the second electrode 190.

The second conductive wiring 145 may be made of the same material as the data wirings 140. That is, the second conductive wiring 145 may include a metal (may be made of a metal such as, e.g., aluminum) having lower resistivity than molybdenum. The second conductive wiring 145 may be formed at the same time as the data wirings 140. In addition, the second conductive wiring 145 may lie in the same plane with the data wirings 140. That is, the second conductive wiring 145 may be formed on a different layer from the first conductive wirings 122.

The second conductive wiring 145 may include a first wiring 145a and a second wiring 145b.

The first wiring 145a may be formed along the edges of the substrate 110. In addition, the first wiring 145a may surround the display area DA. Both ends of the first wiring 145a may be coupled to the power supply unit 320. That is, the first wiring 145a may be directly coupled to the power supply unit 320.

The second wiring 145b may be located inside the first wiring 145a (e.g., inner side of a loop formed by the first wiring 145a). Unlike the first wiring 145a, the second wiring 145b may not surround the display area DA. In addition, both ends of the second wiring 145b may be coupled to the first wiring 145a. Here, both ends of the second wiring 145b that are coupled to the first wiring 145a may be located below the display area DA as oriented in FIG. 1. At least a part of the second wiring 145b may overlap the first conductive wirings 122. In addition, at least part of the second wiring 145b may be perpendicular or orthogonal to the first conductive wirings 122. The second wiring 145b may be located at a corner portion of the substrate 110. In addition, the second wiring 145b may be located in a region adjacent to the flexible circuit film 200. The second wiring 145b may be formed in a region where the first conductive wirings 122 are coupled to the flexible circuit film 200, that is, a region adjacent to lead-in portions of the first conductive wirings 122.

The first wiring 145a and the second wiring 145b may surround at least part of the first conductive wirings 122. That is, the first wiring 145a and the second wiring 145b may form a closed loop, and the first conductive wirings 122 may be located within the closed loop. Here, the closed loop may be formed at a corner portion of the substrate 110 which is adjacent to the flexible circuit film 200.

The second conductive wiring 145 will be described in greater detail later.

The third conductive wirings 144 may be located in the non-display area NDA of the substrate 110. The third conductive wirings 144 may couple the data wirings 140 and the driver 220. That is, the third conductive wirings 144 may receive data signals from the driver 220 and deliver the data signals to the data wrings 140.

The third conductive wirings 144 may be made of the same material as the data wirings 140 and the second conductive wiring 145. That is, the third conductive wirings 144 may include a metal (or made of a metal such as, e.g., aluminum) having lower resistivity than molybdenum. The third conductive wirings 144 may be formed at the same time as the data wirings 140 and the second conductive wiring 145. In addition, the third conductive wirings 144 may lie in the same plane with the data wirings 140 and the second conductive wiring 145.

The flexible circuit film 200 may be coupled at a lower part of the substrate 110. As described above, the flexible circuit film 200 may include the flexible film 210 and the driver 220.

The flexible film 210 may couple the display panel 100 and the circuit board 300 and support the driver 220. The flexible film 210 may be made of a plastic material. In an example embodiment, the flexible film 210 may be made of, but not limited to, a polyimide material.

The driver 220 may be located on the flexible film 210 and may be in the form of an integrated circuit (IC). The driver 220 may generate gate signals and data signals and transmit the gate signals and the data signals to the display panel 100. In some embodiments, the driver 220 may be directly coupled to the first conductive wirings 122 coupled to the gate wirings 120, and the third conductive wirings 144 coupled to the data wirings 140.

The circuit board 300 may be coupled to an end of the flexible circuit film 200. As described above, the circuit board 300 may include the board unit 310 and the power supply unit 320.

The board unit 310 may be a printed circuit board (PCB). Unlike the flexible circuit film 200, the board unit 310 may have rigidity.

The power supply unit 320 may be located on the board unit 310 and may be in the form of an IC. The power supply unit 320 may generate a power supply voltage and apply the power supply voltage to the display panel 100. According to an embodiment, the power supply unit 320 may be directly coupled to the second conductive wiring 145.

Figure 2:
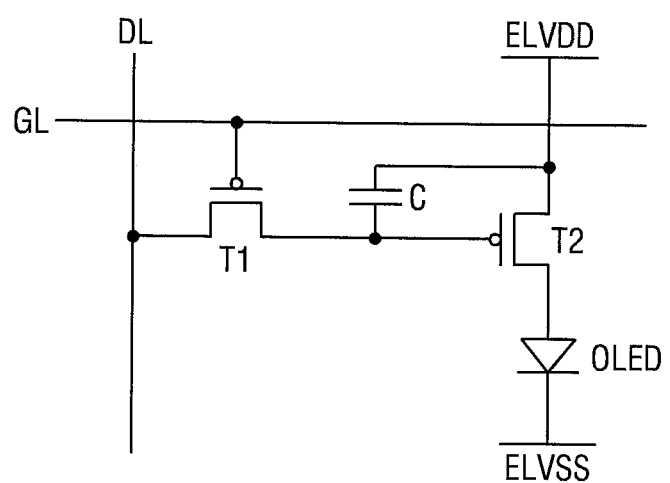
FIG. 2 is an equivalent circuit diagram of a pixel included in the display device of FIG. 1.

An equivalent circuit diagram of a pixel of the display device according to the embodiment of FIG. 1 will now be described below. FIG. 2 is an equivalent circuit diagram of a pixel included in the display device of FIG. 1.

Referring to FIG. 2, a pixel of the display device according to the described embodiment includes an organic light-emitting diode OLED and a pixel circuit for controlling the organic light-emitting diode OLED. The pixel circuit includes a switching transistor T1, a driving transistor T2, and a storage capacitor C.

The switching transistor T1 includes a gate electrode coupled to a gate line GL, a first terminal coupled to a data line DL, and a second terminal coupled to a gate electrode of the driving transistor T2. Here, the gate line GL may be one of the gate wirings 120 of FIG. 1, and the data line DL may be one of the data wirings 140 of FIG. 1.

The driving transistor T2 includes the gate electrode coupled to the second terminal of the switching transistor T1, a first terminal coupled to a pixel power supply line to which a pixel power supply voltage ELVDD is applied, and a second terminal coupled to an anode of the organic light-emitting diode OLED. The power supply line may extend from the power supply unit 320 of FIG. 1 to be coupled to each of the pixels in the display area DA.

The storage capacitor C includes a first terminal coupled to the gate electrode of the driving transistor T2 and a second terminal coupled to the pixel power supply line. The storage capacitor C is charged with a data voltage applied to the gate electrode of the driving transistor T2 and maintains the charged data voltage even after the switching transistor T1 is turned off.

The organic light-emitting diode OLED includes the anode coupled to the second terminal of the driving transistor T2 and a cathode coupled to a common power supply line to which a common power supply voltage ELVSS is applied. Here, the common power supply line may be the second conductive wiring 145 of FIG. 1.

Figure 3:
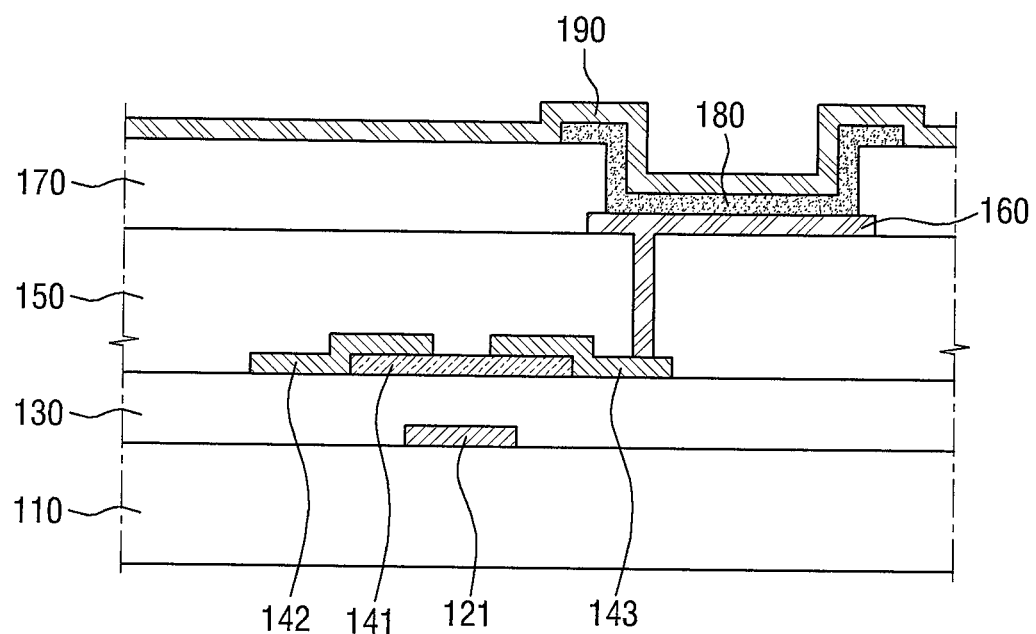
FIG. 3 is a cross-sectional view of a pixel included in the display device of FIG. 1.

A cross-sectional view of a pixel of the display device according to the embodiment of FIG. 1 will now be described. FIG. 3 is a cross-sectional view of a pixel included in the display device of FIG. 1. Here, FIG. 3 is a conceptual diagram which omits the storage capacitor C of FIG. 2, and illustrates the switching transistor T1 and the driving transistor T2 as one transistor, and omits the power supply line and the common power supply line.

Referring to FIG. 3, a gate electrode 121 may be located on the substrate 110. The gate electrode 121 may be made of the same material as the gate wirings 120 of FIG. 1. That is, the gate electrode 121 may include molybdenum (or may be made of molybdenum). The gate electrode 121 may be formed at the same time as the gate wirings 120. In addition, the gate electrode 121 may lie in the same plane with the gate wirings 120.

A gate insulating layer 130 may be located on the gate electrode 121. The gate insulating layer 130 may be made of an insulating material.

A semiconductor pattern 141 may be formed on the gate insulating layer 130. The semiconductor pattern 141 may overlap the gate electrode 121. In an example embodiment, a central portion of the semiconductor pattern 141 may overlap the gate electrode 121, and an edge portion of the semiconductor pattern 141 may not overlap the gate electrode 121.

A source electrode 142 and a drain electrode 143 may be formed on the gate insulating layer 130 and the semiconductor pattern 141. The source electrode 142 and the drain electrode 143 may be formed on both sides of the semiconductor pattern 141 with a gap therebetween. The source electrode 142 and the drain electrode 143 may be made of the same material as the data wirings 140 of FIG. 1. That is, the source electrode 142 and the drain electrode 143 may include a metal (or made of a metal such as, e.g., aluminum) having lower resistivity than molybdenum. The source electrode 142 and the drain electrode 143 may be formed at the same time as the data wirings 140. In addition, the source electrode 142 and the drain electrode 143 may lie in the same plane with the data wrings 140.

As described above, each pixel located in the display area DA of the substrate 110 may include a thin-film transistor (TFT) which includes the gate electrode 121, the semiconductor pattern 141, the source electrode 142 and the drain electrode 143. In FIG. 3, a bottom-gate type TFT is illustrated. However, the present invention is not limited thereto, and a top-gate type TFT may also be used.

A planarization layer 150 may be located on the source electrode 142 and the drain electrode 143. The planarization layer 150 may be made of an insulating material.

A first electrode 160 may be located on the planarization layer 150. The first electrode 160 may be coupled to the drain electrode 143 by a contact hole formed in the planarization layer 150. The first electrode 160 may be made of a conductive material having a high work function. The first electrode 160 may be the anode of the organic light-emitting diode OLED described above with reference to FIG. 2.

A pixel defining layer 170 may be located on the planarization layer 150 and an edge portion of the first electrode 160. In other words, the pixel defining layer 170 may include an opening which exposes a central portion of the first electrode 160. The pixel defining layer 170 may be made of an insulating material.

An organic light-emitting layer 180 may be located on the first electrode 160. That is, the organic light-emitting layer 180 may be located on the first electrode 160 exposed by the pixel defining layer 170. In response to an electric current supplied to the organic light-emitting layer 180, electrons and holes within the organic light-emitting layer 180 may recombine to form excitons, and energy from the excitons may generate light of a certain wavelength.

The organic light-emitting layer 180 may be made of a small molecular weight organic material or a polymer organic material. The organic light-emitting layer 180 may include a hole-injection layer (HIL), a hole-transporting layer (HTL), a hole-blocking layer (HBL), an emitting layer (EML), an electron-transporting layer (ETL), an electron-injection layer (EIL), and an electron-blocking layer (EBL).

The second electrode 190 may be located on the pixel defining layer 170 and the organic light-emitting layer 180. The second electrode 190 may be made of a conductive material with a low work function. The second electrode 190 may be the cathode of the organic light-emitting diode OLED described above with reference to FIG. 2.

Figure 4:
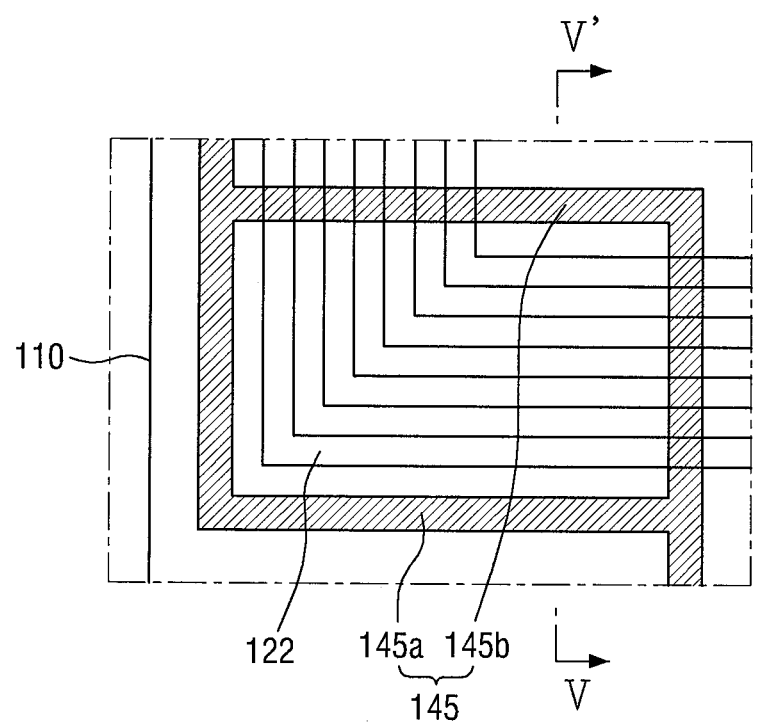
FIG. 4 is an enlarged plan view of the portion IV of FIG. 1.
Figure 5:
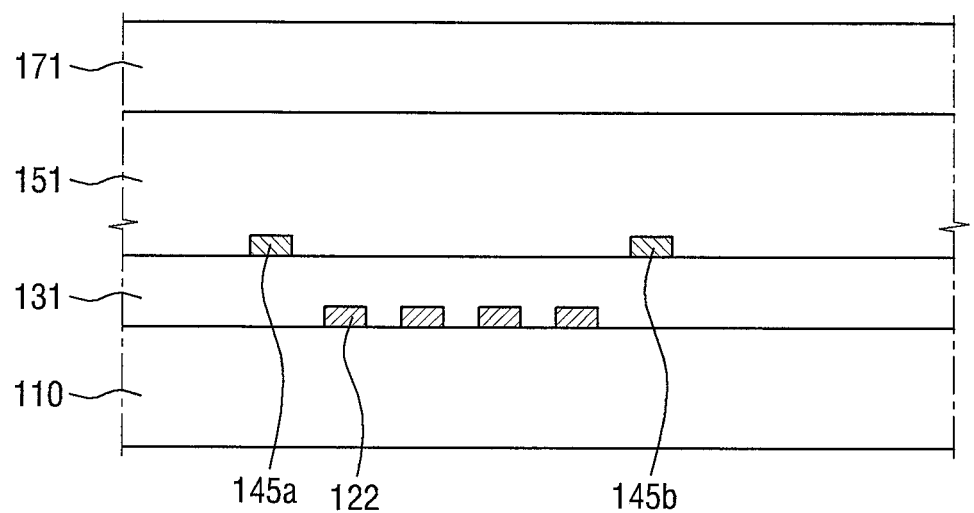
FIG. 5 is a cross-sectional view taken along the line V-V of FIG. 4.

The second conductive wiring 145 according to an embodiment of the present invention will now be described in more detail with reference to FIGS. 4 and 5. FIG. 4 is an enlarged plan view of the portion IV of FIG. 1. FIG. 5 is a cross-sectional view taken along the line V-V' of FIG. 4.

Referring to FIGS. 4 and 5, the first conductive wirings 122 may be located on the substrate 110. The first conductive wirings 122 may be made of the same material as the gate electrode 121 of FIG. 3. The first conductive wirings 122 may be formed at the same time as the gate electrode 121. In addition, the first conductive wirings 122 may lie in the same plane with the gate electrode 121.

A first insulating layer 131 may be located on the first conductive wirings 122. The first insulating layer 131 may be made of an insulating material. In some embodiments, the first insulating layer 131 may be made of the same material as the gate insulating layer 130 of FIG. 3. The first insulating layer 131 may be formed at the same time as the gate insulating layer 130. The first insulating layer 131 may lie in the same plane with the gate insulating layer 130. That is, the first insulating layer 131 may be an extension of the gate insulating layer 130 which is located in the non-display area NDA of the substrate 110.

The second conductive wiring 145 may be located on the first insulating layer 131. The second conductive wiring 145 may be made of the same material as the source electrode 142 and the drain electrode 143 of FIG. 3. In addition, the second conductive wiring 145 may be formed at the same time as the source electrode 142 and the drain electrode 143. The second conductive wiring 145 may lie in the same plane with the source electrode 142 and the drain electrode 143. The second conductive wiring 145 may be electrically coupled to the second electrode 190 of FIG. 3 by a contact hole.

A second insulating layer 151 may be located on the second conductive wiring 145. The second insulating layer 151 may be made of an insulating material. In addition, the second insulating layer 151 may be made of the same material as the planarization layer 150 of FIG. 3. The second insulating layer 151 may be formed at the same time as the planarization layer 150. The second insulating layer 151 may lie in the same plane with the planarization layer 150. That is, the second insulating layer 151 may be an extension (e.g., an extension portion) of the planarization layer 150 which is located in the non-display area NDA of the substrate 110.

A third insulating layer 171 may be located on the second insulating layer 151. The third insulating layer 171 may be made of an insulating material. In addition, the third insulating layer 171 may be made of the same material as the pixel defining layer 170 of FIG. 3. The third insulating layer 171 may be formed at the same time as the pixel defining layer 170. The third insulating layer 171 may lie in the same plane with the pixel defining layer 170. That is, the third insulating layer 171 may be an extension (e.g., an extension portion) of the pixel defining layer 170 which is located in the non-display area NDA of the substrate 110.

In the display device according to the described embodiment, the second conductive wiring 145 located in the non-display area NDA of the substrate 110 can prevent wirings inside the second conductive wiring 145 from being damaged by electrostatic discharge (ESD).

For example, the first wiring 145a of the second conductive wiring 145 can prevent ESD from being introduced into the display panel 100 by surrounding the display area DA and also wirings (e.g., the first conductive wirings 122 and the third conductive wirings 144) adjacent to the display area DA using the first wiring 145a.

In some embodiments, because the second wiring 145b of the second conductive wiring 145 is placed in a portion particularly vulnerable to ESD, a double ESD prevention structure can be formed. For example, a corner of the substrate 110 which is adjacent to the flexible circuit film 200 is particularly vulnerable to ESD, and there may be limitations in protecting the corner of the substrate 110 from EDS using the first wiring 145a alone. Therefore, the second wiring 145b having both ends coupled to the first wiring 145a may be placed at the corner of the substrate 110 which is adjacent to the flexible circuit film 200, such that the first wiring 145a and the second wiring 145b form a closed loop. As a result, the first conductive wirings 122 inside the closed loop can be protected more stably.

In some embodiments, the resistivity of the second conductive wiring 145 is lower than that of the first conductive wirings 122. Therefore, the second conductive wiring 145 can diffuse external ESD farther than the first conductive wirings 122, thereby preventing big damage that may occur locally. For example, because the second conductive wiring 145 is placed along the edges of the substrate 110 to surround the display area DA, it can better diffuse ESD.

Because the power supply voltage is applied to the second conductive wiring 145, a more effective ESD prevention structure can be formed. If the second conductive wiring 145 is a floating metal, it may serve as a stepping stone for external ESD to reach the display panel 100. However, because the power supply voltage is applied to the second conductive wiring 145, it can prevent the second conductive wiring 145 from serving as a stepping stone.

Figure 6:
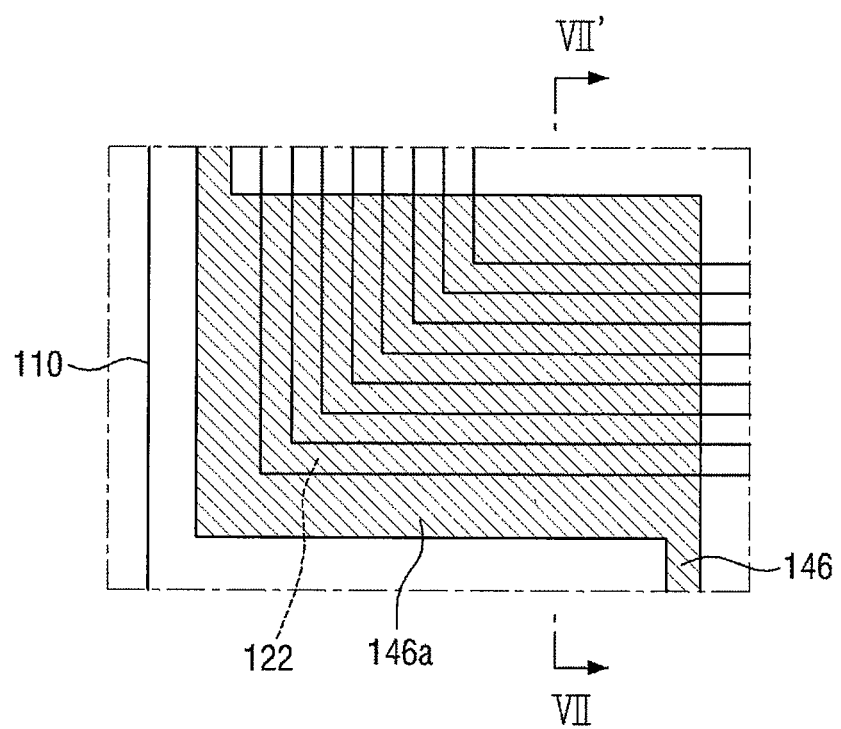
FIG. 6 is a partial enlarged plan view of a display device according to another embodiment of the present invention.
Figure 7:
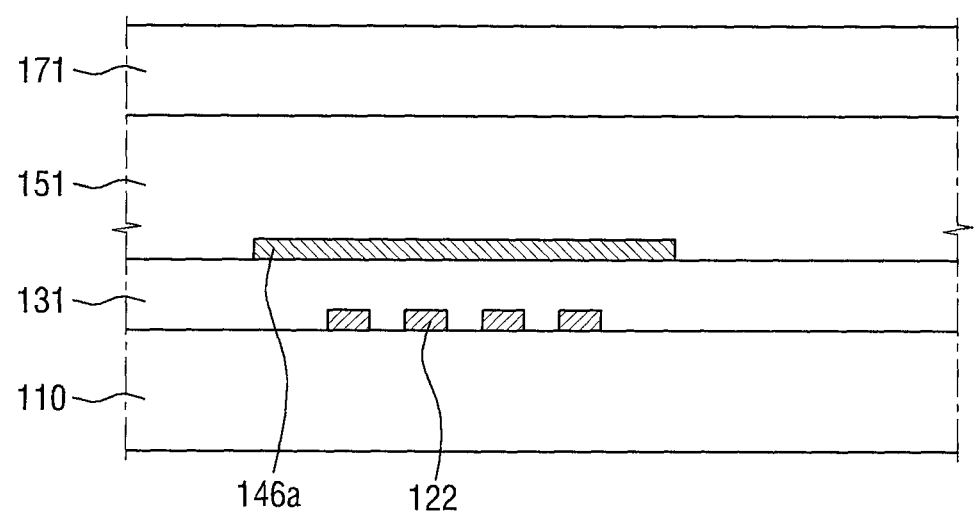
FIG. 7 is a cross-sectional view taken along the line VII-VII' of FIG. 6.

FIG. 6 is a partial enlarged plan view of a display device according to another embodiment of the present invention. That is, FIG. 6 illustrates a modified version of the embodiment of FIG. 4. FIG. 7 is a cross-sectional view taken along the line VII-VII' of FIG. 6. For simplicity, elements substantially identical to those of FIG. 1 are indicated by like reference numerals, and thus a redundant description thereof will be omitted.

Referring to FIGS. 6 and 7, a second conductive wiring 146 may include an extension portion 146a. The extension portion 146a may be rectangular as illustrated in FIG. 6, but the shape of the extension portion 146a is not limited to the rectangular shape. The extension portion 146a may overlap the first conductive wirings 122 located at a corner of a substrate 110 which is adjacent to a flexible circuit film 200.

The extension portion 146a partially covering the first conductive wirings 122 can prevent external ESD from reaching the first conductive wirings 122. That is, the extension portion 146a may function as an ESD prevention shield. In addition, because external ESD is diffused by the extension portion 146a having a large area, the intensity of the ESD may be reduced. That is, the extension portion 146a can reduce the intensity of ESD. In addition, the extension portion 146a can perform all functions of the second wiring 145b of FIG. 1.

Figure 8:
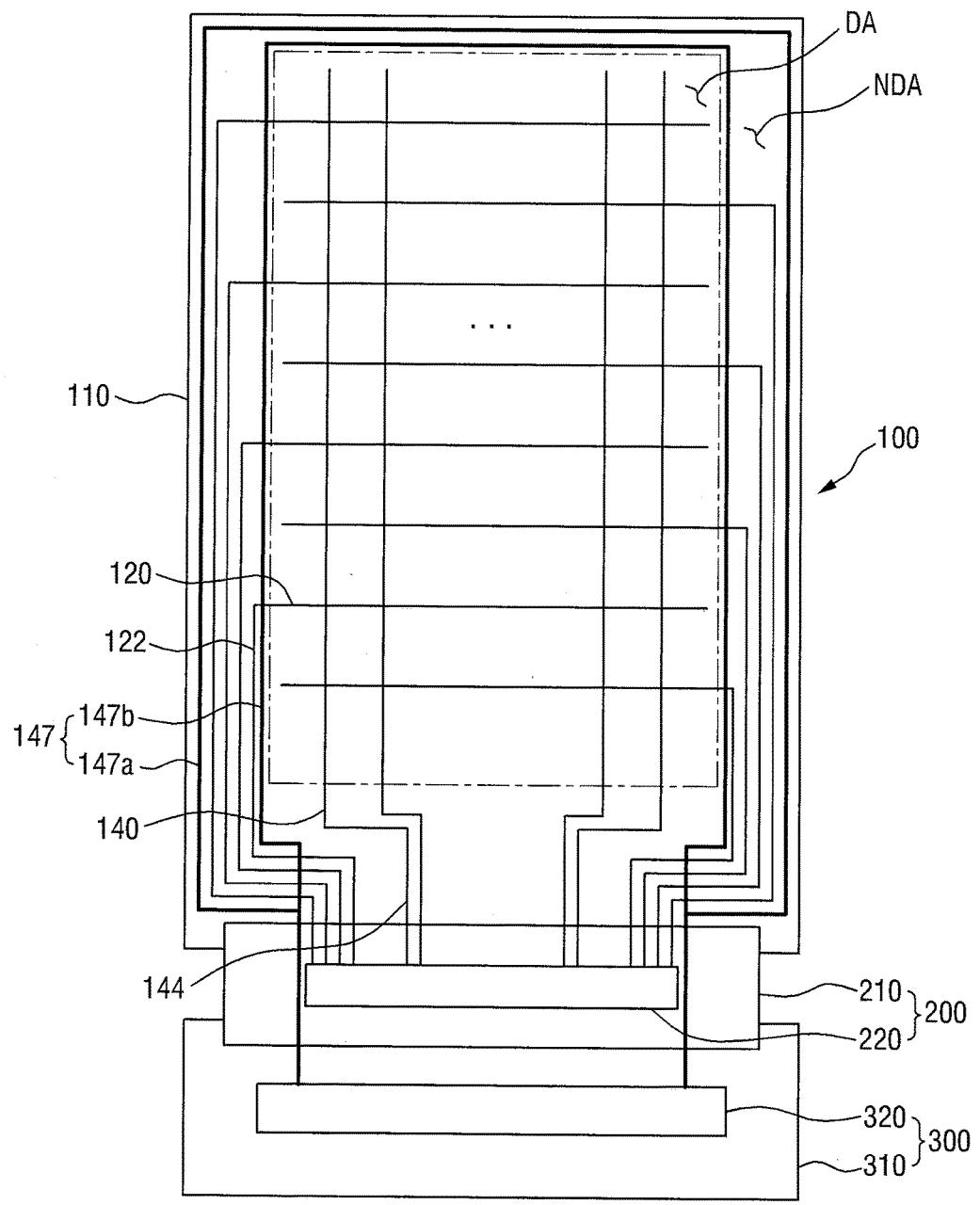
FIGS. 8 through 10 are plan views of display devices according to other embodiments of the present invention.

FIG. 8 is a plan view of a display device according to another embodiment of the present invention. For simplicity, elements substantially identical to those of FIG. 1 are indicated by like reference numerals, and thus a redundant description thereof will be omitted.

Referring to FIG. 8, a first wiring 147a of a second conductive wiring 147 and also a second wiring 147b of the second conductive wiring 147 may surround the display area DA. Here, an end of the second wiring 147b may be coupled to the first wiring 147a located in a lower left part of a substrate 110, and the other end of the second wiring 147b may be coupled to the first wiring 147a located in a lower right part of the substrate 110. That is, a closed loop formed by the first wiring 147a and the second wiring 147b may surround the display area DA.

In the display device according to the described embodiment, the closed loop formed by the first wiring 147a and the second wiring 147b may surround the first conductive wirings 122 located in regions adjacent to a the flexible circuit film 200 and also on both sides of the display area DA. Therefore, the first conductive wirings 122 can be protected more stably from ESD.

Figure 9:
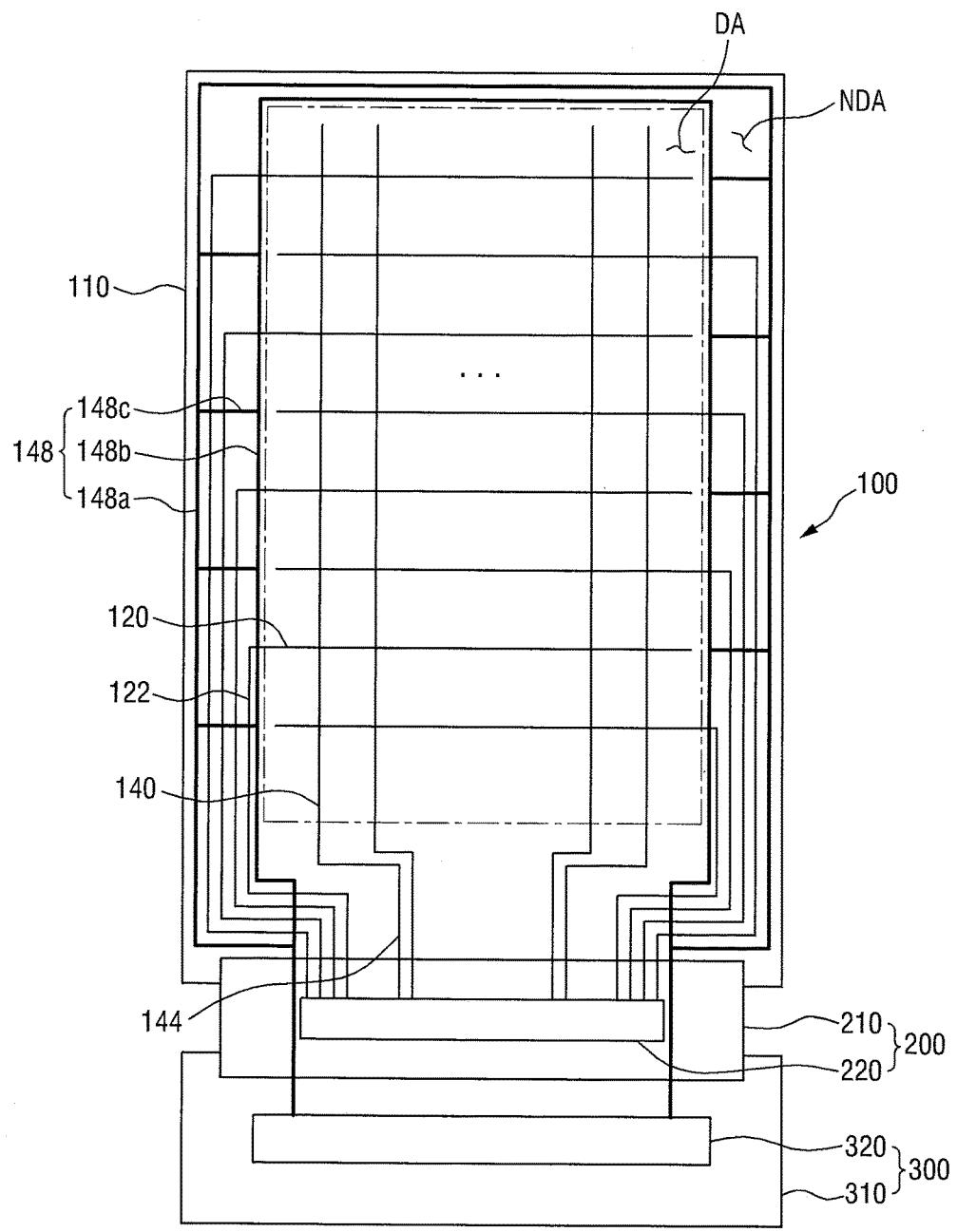

FIG. 9 is a plan view of a display device according to another embodiment of the present invention. For simplicity, elements substantially identical to those of FIG. 1 are indicated by like reference numerals, and thus a redundant description thereof will be omitted.

Referring to FIG. 9, both a first wiring 148a and a second wiring 148b of a second conductive wiring 148 may surround the display area DA. In addition, the second conductive wiring 148 may further include bridge wirings 148c which couple the first wiring 148a and the second wiring 148b. At least some of the bridge wirings 148c may overlap first conductive wirings 122. In addition, the bridge wirings 148c may be orthogonal (or perpendicular) to the first conductive wirings 122.

In the display device according to the described embodiment, the bridge wirings 148c added between the first wiring 148a and the second wiring 148b can prevent a voltage difference between the first wiring 148*a* and the second wiring 148*b* and improve an ESD diffusion function by additionally forming paths through which ESD can be diffused.

Figure 10:
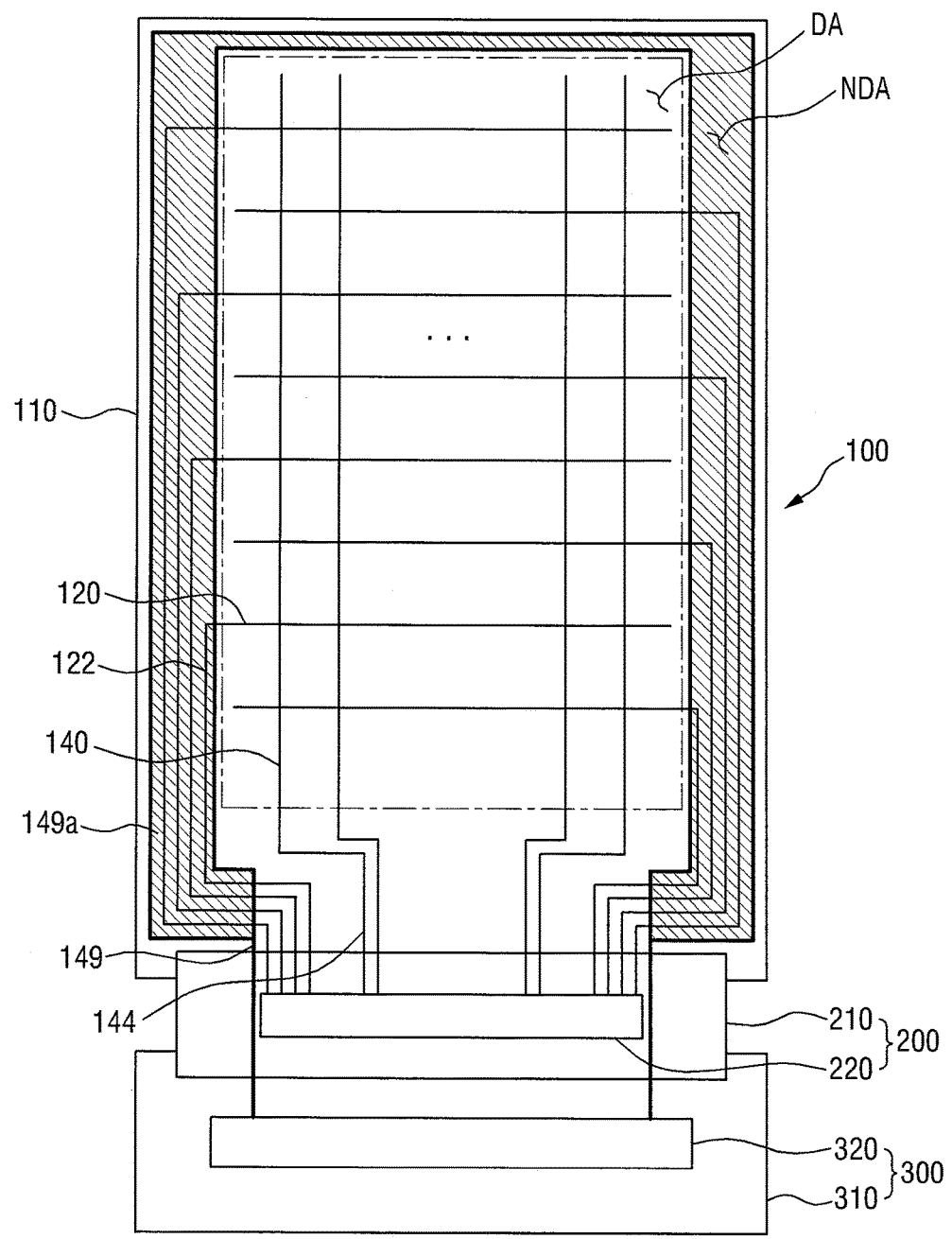

FIG. 10 is a plan view of a display device according to another embodiment of the present invention. For simplicity, elements substantially identical to those of FIG. 1 are indicated by like reference numerals, and thus a redundant description thereof will be omitted.

Referring to FIG. 10, an extension portion 149*a* of a second conductive wiring 149 may surround a display area DA. That is, the extension portion 149*a* of the second conductive wiring 149 may be formed in regions adjacent to the flexible circuit film 200 and surround the display area DA.

In the display device according to the described embodiment, the extension portion 149*a* may surround the first conductive wirings 122 in the regions adjacent to the flexible circuit film 200 and also on both sides of the display area DA. Therefore, the first conductive wirings 122 can be protected more stably from ESD.

Embodiments of the present invention provide at least one of the following features.

That is, a plurality of wirings inside a display device can be protected from ESD.

However, the embodiments of the present invention are not restricted to the ones set forth herein. The above and other embodiments of the present invention will become more apparent to one of ordinary skill in the art to which the present invention pertains by referencing the claims.

While the present invention has been particularly shown and described with reference to example embodiments thereof, it will be understood by those of ordinary skill in the art that various changes in forms and details may be made therein without departing from the spirit and scope of the present invention as defined by the following claims. It is therefore desired that the present embodiments be considered in all respects as illustrative and not restrictive, with reference being made to the appended claims and their equivalents.

What is claimed is:

1. A display device comprising:
    a substrate comprising a display area and a non-display area adjacent the display area;
    a plurality of pixels on the substrate in the display area;
    a plurality of first conductive wirings at the non-display area of the substrate;
    a second conductive wiring at the non-display area of the substrate and on one of the first conductive wirings; and
    a power supply configured to provide a power supply voltage to a common power supply line coupled to each of the pixels via the second conductive wiring,
    wherein the second conductive wiring is insulated from the first conductive wirings,
    wherein each of the first conductive wirings has a first portion extending in a first direction, and a second portion extending in a second direction crossing the first direction, the first portion and the second portion forming a vertex, and
    wherein the second conductive wiring overlaps the vertices.

2. The display device of claim 1, wherein a gate voltage is applied to the first conductive wirings.

3. The display device of claim 1, wherein the second conductive wiring has a lower resistivity than the first conductive wirings.

4. The display device of claim 1, wherein a portion of the second conductive wiring that overlaps the vertices is at a corner of the substrate.

\* \* \* \* \*